(12) United States Patent
Sutskover et al.

(10) Patent No.: US 8,464,121 B2
(45) Date of Patent: Jun. 11, 2013

(54) LDPC CODES WITH SMALL AMOUNT OF WIRING

(75) Inventors: Ilan Sutskover, Hadera (IL); Chen Kojokaro, Yoqneam ilit (IL)

(73) Assignee: Intel Corporation, Santa Clara, CA (US)

( * ) Notice: Subject to any disclaimer, the term of this patent is extended or adjusted under 35 U.S.C. 154(b) by 805 days.

(21) Appl. No.: 12/558,415

(22) Filed: Sep. 11, 2009

(65) Prior Publication Data

US 2010/0174965 A1    Jul. 8, 2010

Related U.S. Application Data

(60) Provisional application No. 61/142,964, filed on Jan. 7, 2009.

(51) Int. Cl.
*H03M 13/11* (2006.01)
*H03M 13/27* (2006.01)

(52) U.S. Cl.
USPC .......................................... 714/752; 714/799

(58) Field of Classification Search
None
See application file for complete search history.

(56) References Cited

U.S. PATENT DOCUMENTS

| | | | | |
|---|---|---|---|---|
| 5,293,489 | A * | 3/1994 | Furui et al. | 710/317 |
| 8,209,578 | B2 * | 6/2012 | Galbraith et al. | 714/752 |
| 2005/0138519 | A1 * | 6/2005 | Boutillon et al. | 714/752 |
| 2010/0037121 | A1 * | 2/2010 | Jin et al. | 714/763 |

* cited by examiner

*Primary Examiner* — Ajay Bhatia
*Assistant Examiner* — Dipakkumar Gandhi
(74) *Attorney, Agent, or Firm* — Pillsbury Winthrop Shaw Pittman LLP

(57) ABSTRACT

The embodiments herein relate to Low Density Parity Check (LDPC) codes, their corresponding matrices, and with an LDPC decoder architecture used to decode those codes. Embodiments herein relate to methods to generate a set of LDPC codes (typically of different rates) that share their wires as much as possible and therefore reduce the silicon area and ease the routing.

14 Claims, 11 Drawing Sheets

| | | | | | | | | | | | | | | | |
|---|---|---|---|---|---|---|---|---|---|---|---|---|---|---|---|
| 15 | -1 | 34 | -1 | -1 | 32 | -1 | 36 | -1 | 37 | -1 | -1 | 0 | 0 | -1 | -1 |
| -1 | 21 | -1 | 39 | 9 | -1 | 28 | -1 | -1 | -1 | -1 | 0 | -1 | -1 | 0 | 0 |
| -1 | 0 | -1 | 36 | -1 | 22 | -1 | 10 | -1 | -1 | 20 | -1 | -1 | 22 | 16 | -1 |
| 30 | -1 | 26 | -1 | 18 | -1 | 14 | -1 | 40 | -1 | -1 | 10 | 23 | -1 | -1 | -1 |
| 3 | -1 | 19 | -1 | 27 | -1 | -1 | 36 | 38 | 32 | -1 | -1 | -1 | -1 | -1 | -1 |
| -1 | 21 | -1 | 33 | -1 | 12 | 0 | -1 | -1 | 40 | 20 | -1 | -1 | -1 | -1 | -1 |
| -1 | 0 | -1 | 0 | -1 | 0 | -1 | 0 | -1 | 0 | 0 | -1 | -1 | -1 | -1 | -1 |
| 0 | -1 | 0 | -1 | 0 | -1 | 0 | -1 | 0 | -1 | -1 | -1 | -1 | -1 | -1 | -1 |

A companion code matrix with rate ½

FIG. 11

```
-1  -3  -6  -8  -10  -13  Inf  -11  -2  -4  -5  -7  -9  Inf  Inf  -12
 9  10  11   4    8   16  -14   13   1   2   3  12   5  Inf  Inf    6
 9  10  11   4    5    7    6    8   1   2   3  12  13  -15  Inf   16
 9  10  11   4  Inf   16    6    8   1   2   3  12  13   14  -16    7
 9  10  11   4   13    6  Inf    5   1   2   3  12  13    8  Inf   16
 9  10  11   4    8   16    7   13   1   2   3  12   5  Inf  Inf    6
 9  10  11   4    5    7    6    8   1   2   3  12  13   14  Inf   16
 9  10  11   4  Inf   16    6    8   1   2   3  12  13   14   15    7
```

```
18  41  31  21  24  12  18   3  19  39   3  34  28  Inf  Inf  Inf
 7  18   1  31  24  10  36  41   1   6  20  29  21  18   Inf  Inf
10   7  31  21  24  10  18   3  22   6  19  29  29  35   28  Inf
 7  18  21  11  12  10  12  37   0  33  Inf  34   6  31   14    0
```

| 0 | -1 | 0 | -1 | 0 | -1 | 0 | -1 | 0 | -1 | -1 | 0 | 0 | -1 | -1 | -1 |
|---|---|---|---|---|---|---|---|---|---|---|---|---|---|---|---|
| -1 | 0 | -1 | 0 | -1 | 0 | -1 | 0 | -1 | -1 | 0 | -1 | -1 | 0 | 0 | -1 |
| -1 | 18 | -1 | 31 | 6 | -1 | 30 | -1 | 1 | -1 | -1 | -1 | 29 | 35 | -1 | -1 |
| 41 | -1 | 1 | -1 | -1 | 10 | -1 | 41 | -1 | 0 | 20 | 29 | -1 | -1 | -1 | -1 |
| 17 | 25 | 32 | 10 | 12 | 20 | 18 | 40 | -1 | 39 | -1 | 21 | 8 | 24 | 21 | 0 |
| 24 | 35 | 11 | 21 | 36 | 32 | 12 | 39 | 41 | 3 | 22 | -1 | -1 | -1 | -1 | -1 | ual
LDPC CODES WITH SMALL AMOUNT OF WIRING

CROSS-REFERENCE TO RELATED APPLICATION

This application claims priority and benefit to U.S. Provisional Patent Application No. 61/142,964, filed on Jan. 7, 2009. The contents of this application is incorporated herein in its entirety by reference.

TECHNICAL FIELD

The embodiments herein relate to Low Density Parity Check (LDPC) decoder architecture for processing Low Density Parity Check (LDPC) codewords.

BACKGROUND

Low Density Parity Check (LDPC) codes are used for error correcting in noisy channels. The LDPC codes are used for encoding a message into an LDPC codeword and for decoding a noisy version of that codeword in a receiver. LDPC codes appear in various standards, such as IEEE 802.16e, IEEE 802.11n, DVB-T2, IEEE 802.15.3c, and the ITU G.hn standard. Standardization of 60 GHz systems in the Wireless Gigabit Alliance (WGA) has also agreed already to be using LDPC codes.

An LDPC code is a linear block code and can be defined by a parity check matrix which is more specifically known as an LDPC code matrix. The LDPC codes have parity check matrix which is sparse, meaning it has very few non-zero entries. The code rate is $R=1-M/N$, where N is the number of columns in the matrix, representing the size of the code, and M is the number of rows in the matrix, representing the number of parity check equations. An example of a linear block code with $N=7$, $M=3$, is shown in relation (1) below:

$$\begin{bmatrix} 1 & 0 & 1 & 0 & 1 & 0 & 1 \\ 0 & 1 & 1 & 0 & 0 & 1 & 1 \\ 0 & 0 & 0 & 1 & 1 & 1 & 1 \end{bmatrix}$$

Quasi-cyclic (QC) LDPC matrices are known (e.g., in IEEE 802.11n and in IEEE 802.15.3c) and they can be concisely described. Note that a permutation matrix is a matrix that has a single "1" in each row and a single "1" in each column. For example the below matrix is a 8×8 permutation matrix. Moreover, the below permutation matrix is a cyclic permutation matrix. The QC LDPC is made of cyclic permutation matrices.

$$\begin{matrix} 0 & 0 & 0 & 1 & 0 & 0 & 0 & 0 \\ 0 & 0 & 0 & 0 & 1 & 0 & 0 & 0 \\ 0 & 0 & 0 & 0 & 0 & 1 & 0 & 0 \\ 0 & 0 & 0 & 0 & 0 & 0 & 1 & 0 \\ 0 & 0 & 0 & 0 & 0 & 0 & 0 & 1 \\ 1 & 0 & 0 & 0 & 0 & 0 & 0 & 0 \\ 0 & 1 & 0 & 0 & 0 & 0 & 0 & 0 \\ 0 & 0 & 1 & 0 & 0 & 0 & 0 & 0 \end{matrix}$$

Communication systems typically require more than one coding rate, which for a system using LDPC codes imply support of more than one LDPC code. Methods for efficient design of a LDPC decoder that supports multiple codes are therefore of great interest. Moreover, LDPC codes that result in low-cost low-power consumption efficient decoder are also of great interest.

BRIEF DESCRIPTION OF THE FIGURES

FIG. 1 illustrates an example of a generated LDPC code which is being represented as a matrix.

FIG. 5 An illustration of the layers of a Matrix.

FIG. 10 illustrates a possible companion code matrix with rate ½.

FIG. 11 illustrates an example Location Matrix corresponding to the parity check matrix in FIG. 10.

FIG. 12 illustrates an example Routing Matrix corresponding to the parity check matrix in FIG. 10.

FIG. 13 illustrates a possible companion code matrix with rate ⅝ of the matrix in FIG. 5.

FIG. 14 illustrates a possible companion code matrix with rate ¾ of the matrix in FIG. 5.

FIG. 15 illustrates an example LDPC code matrix.

FIG. 16 illustrates an example differential permutation matrix associated with FIG. 15.

FIG. 17 illustrates an example LDPC code matrix with rate ½.

FIG. 18 illustrates an example LDPC code matrix with rate ⅝.

FIG. 19 illustrates an example LDPC code matrix with rate ⅝.

DETAILED DESCRIPTION

Defined Terms

Figure 2:
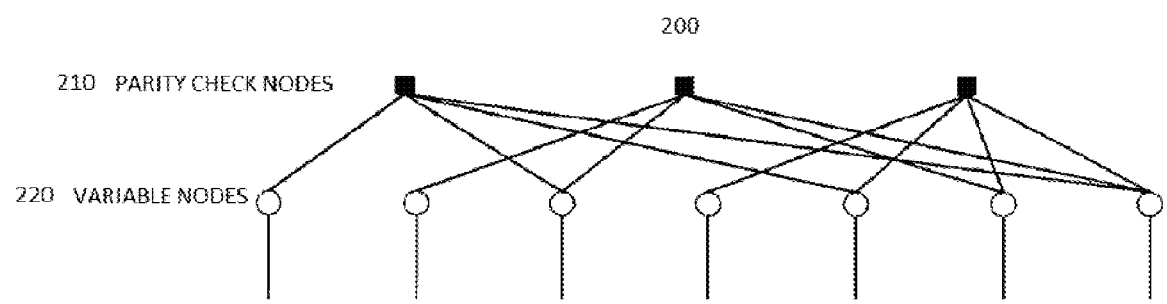
FIG. 2 illustrates a bipartite graph to represent an LDPC code matrix.

Layer:
  A layer can broadly be defined as a submatrix of the parity check matrix containing portion of the rows but all the columns, whereas this submatrix is independently processed with respect to other layers.

Quasi-Efficiently Connected:
  An input port to a parity check processor is quasi-efficiently connected if the ratio between the number of possible paths to the number of used paths with respect to that input port is small. For example, the set of all possible paths between input ports and output ports may be no more than twice the number of used paths. Accordingly, a decoder may be quasi-efficient if a substantial amount of input ports are quasi-efficiently connected.

Wiring Metric:
  A metric measuring the amount of wires needed to support a pair of LDPC codes by an efficiently connected decoder, with respect to the amount of wires same decoder utilizes for the decoding of each of the two codes. More precisely, if $X_1$ stands for the number of wires that would be used during decoding of first code, $X_2$ stands for the number of wires that would be used during decoding of second code and $X_3$ stands for the number of wires that is used in either case, then the metric is defined by $(X_3-\max\{X_1,X_2\})/\min\{X_1,X_2\}$. The two extreme cases of this metric is (1) zero—when all the wires required for one codes are serving also the other code, and (2) one—when none of the wires are reused between the codes.

Differential Permutation Matrix:
    A matrix corresponding to a parity check matrix and its layer partitioning, where each entry in the differential permutation matrix is equal to the difference of corresponding cyclic permutations in the parity check matrix in two successive layers.

Similarity Metric:
    A metric measuring similarity between two LDPC codes. The metric is equal to the ratio of the number of non-identical entries between two differential permutation matrices (associated with each of two LDPC code matrices) to the total number of entries in one of the differential permutation matrices. Both differential permutation matrices are of same size.

The embodiments herein relate to Low Density Parity Check (LDPC) codes, their corresponding matrices, and an LDPC decoder architecture for decoding LDPC codewords. Embodiments herein also include the design of LDPC codes that allow efficient sharing of hardware for multiple LDPC codes. Sharing hardware for supporting multiple codes will reduce the amount of wiring required for a decoder. Reducing the number of wires has several advantages relating to routing, silicon area and power consumption. Having many wires makes on-chip routing very complex. When routing becomes complex, more area is required to lay the wires. When there are more wires, more multiplexer inputs are required which leads to larger multiplexers or more multiplexers and this has a rather significant impact on the silicon area size. Although power consumption is only marginally effected by small modifications to the number of wires, tripling the number of wires may introduce relatively large power consumption additions in the order of 20% perhaps. Embodiments herein relate to methods to generate a set of LDPC codes (typically of different rates) that share their wires as much as possible and therefore reduce the silicon area and ease the routing. In other words, it is easy to design multiple codes that are non-similar and share little hardware, it is relatively easy to design codes that are very similar and thus share a lot of hardware and it is not trivial to design codes that are dissimilar but share a lot of hardware. The design of the later is in one of the focuses of this patent.

One possible embodiment could be a low density parity check decoder with a parity check processing unit having input ports and output ports. Some of the ports contain memory, and a majority of the input ports are each quasi-efficiently connected to at least two of the output ports. The input ports can select between the output ports during the decoding of a low density parity check codeword. The decoder decodes the low density parity check codeword using a single low density parity check code, each of the input ports has a number of connections to output ports, the number of connections is less than or equal to the number of layers. The decoder has at least one multiplexer connected to the input port and at least one of the output ports and can select between the output ports during the decoding of a low density parity check codeword.

Another embodiment could be as low density parity check code matrix having a plurality of entries configured for processing a low density parity check codeword. The plurality of entries are associated with a first differential permutation matrix, a similarity metric and a wiring metric. The similarity metric representing a number of non-identical entries between the first differential permutation matrix and a second differential permutation matrix associated with a companion low density parity check code matrix. The similarity metric having a value below a similarity threshold value of 0.5. The wiring metric representing an amount of wires needed to implement the low density parity check code matrix and the companion low density parity check code matrix. The wiring metric having a value below a wiring threshold value equal to 0.45. The resulting matrix could have code rate ½, ¾ or ⅝ and have the majority of the entries of FIG. 3, FIG. 15 or FIG. 19 respectively.

Another embodiment is as a method using two or more low density parity check codes for processing low density parity check codewords. Each of the low density parity check codes being represented by a low density parity check code matrix and at least two of the two or more low density parity check code matrices are associated with a wiring metric and a similarity metric. The wiring metric being below a wiring threshold value such as 0.45 and the similarity metric being below a similarity threshold value such as 0.5. The processing of the low density parity check codewords could be either decoding or encoding. One low density parity check code could be a low density parity check code matrix having a code rate ½, ¾ or ⅝ with a majority of the entries from FIG. 3, FIG. 15 or FIG. 19 respectively.

Figure 1:
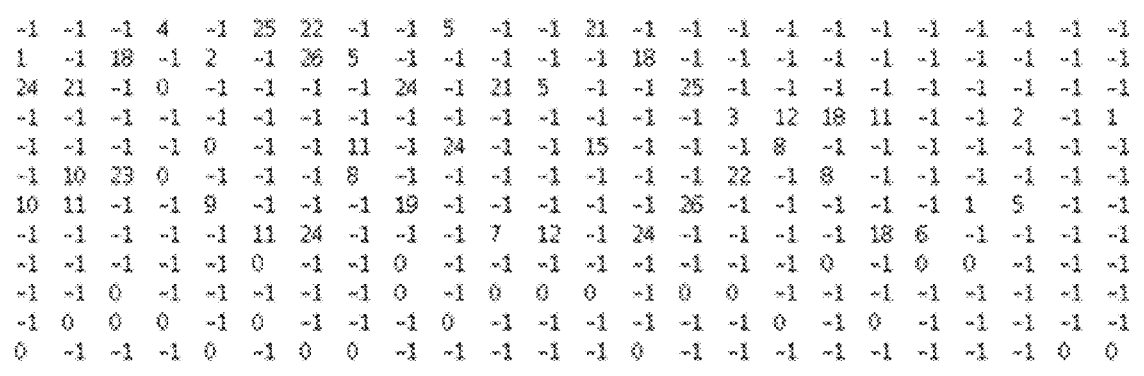

FIG. 1 illustrates an example of a LDPC parity check matrix associated with a LDPC code. LDPC codes can be represented via a matrix but can also be represented in other forms such as for example a bipartite graph. For the purposes of this embodiment we choose to describe the LDPC code in a matrix form. The matrix rows correlate to parity check equations. For quasi-cyclic (QC) LDPC codes, such as the code illustrated in FIG. 1, each matrix column correlates to a sub-block of Z bits of a codeword. Each entry in the matrix represents a permutation matrix of size Z×Z. In this example the exemplified matrix has 24 columns and Z=28, so this matrix is associated with a code of length 28*24=672 bit. Each LDPC code has a code rate which is K/N. For every K bits of useful information, the encoder generates totally N bits of data, introducing some redundancy. Parity check matrices, when in a compact format (for example, without repeating a row twice) have N columns and N-K rows. The LDPC code in FIG. 1 has a code rate ½. The terms LDPC code, LDPC code matrix and LDPC parity check matrix can be used interchangeably.

FIG. 2 illustrates a bipartite graph 200 which can also be used to effectively represent an LDPC code. In a bipartite graph 200 the nodes in the graph are separated into two distinctive sets and edges are only connecting nodes of two different types. The two types of nodes in the bipartite graph are called variable nodes 220 and check nodes 210. One variable node 220 represents one bit in the codeword (for binary codes), corresponding to one column of the parity check matrix. One check node 210 represents one parity check equation, corresponding to one row of a parity check matrix. FIG. 2 shows a graph representation 200 of a (7,4) parity check codes an open circle represents the variable node, and a solid square represents the check node.

Figure 3:
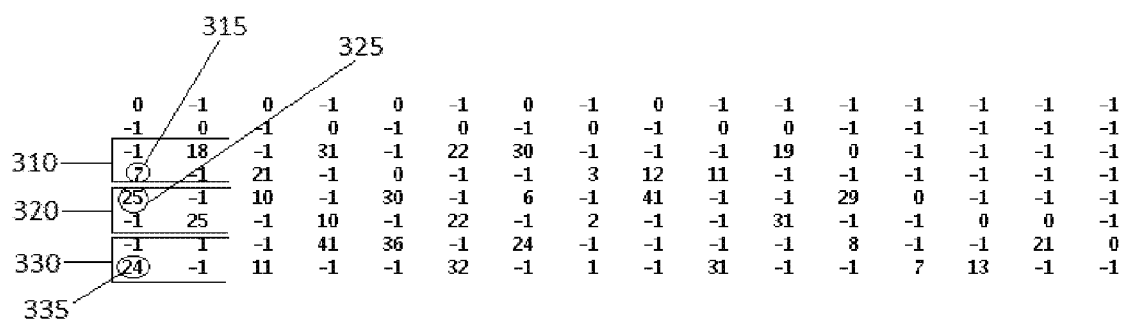
FIG. 3 illustrates a parity check matrix for rate ½.

In FIG. 3 a parity check matrix corresponding to a rate ½ LDPC code is exemplified. The code has 16 columns each associated with Z=42 code bits, hence block length is 16*42=672 bit. The embodiments herein are not restricted to these values in any way. Using the conventions of quasi-cyclic LDPC codes, every entry of this matrix corresponds to a Z×Z submatrix. A non-negative entry is associated with a cyclic permutation with number of steps indicated by the entry's value. All values are positive and range between 0 (no permutation) and between Z−1 (one step to the left). Negative numbers (only −1) correspond to lack of connectivity, meaning a Z×Z submatrix containing only zeros. In this application, the terms column and columns may refer to either of the quasi-cyclic representation, in which case there would be N columns, or to the LDPC code matrix that has N×Z columns. The proper meaning is understood from the context.

Figure 4:
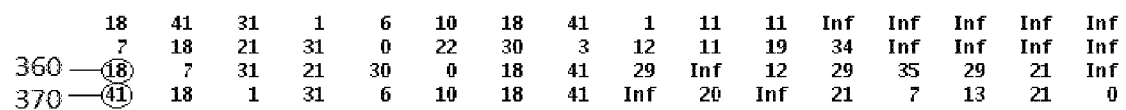
FIG. 4 A differential permutation matrix associated with the FIG. 3 parity check matrix.

In FIG. 4 a differential permutation matrix associated with the parity check matrix of FIG. 3 is provided. This matrix is prepared under the assumption of 4 layers and where every two successive rows of the matrix in FIG. 3 constitute a layer. Every entry in a differential permutation matrix represents the difference of corresponding two permutations (i.e., entries) specified by the parity check matrix (like FIG. 3). For example, the permutation associated with first column and second layer (in FIG. 3) equals 7 (315) and the permutation associated with first column and third layer equals 25 (325) and hence their difference equals 18 which is the value 360 indicated by the first column and the third row of the differential permutation matrix FIG. 4. Similarly, addressing first column and the permutations in third 320 and fourth 330 layers, 25 (325) and 24 (335) respectively, the value in the first column and fourth row of the differential permutation matrix is equal to 24−25 modulo Z=(−1) modulo 42=41 (370). An entry of the differential permutation matrix is associated with difference of permutations in the parity check matrix in same column and in the row associated with the destination permutation, i.e., the permutation corresponding to the next layer to be processed. First row of the differential permutation matrix corresponds to traversing from last layer of the parity check matrix to first layer of the parity check matrix.

FIG. 5 displays an example layering of an LDPC code matrix. In a preferred embodiment the processing of a LDPC code matrix would use layered belief propagation. Layered belief propagation is an algorithm in which the matrix rows are divided into "layers" and each layer is processed in its turn. A layer can broadly be defined as a submatrix of the parity check matrix containing portion of the rows but all the columns, whereas this submatrix is independently processed with respect to other layers. In this example layers are defined such that the submatrix defined by every layer has column degree less than or equal to 1, meaning that a column is processed by no more than a single row processor when that layer is processed; such a case is demonstrated in FIG. 5 where we consider the matrix to be processed by 4 layers with each layer comprising 2 rows. However, there are ways to handle layers with higher column degrees, such as, for example layers with degree less than or equal to 2 or anything larger.

Figure 6:
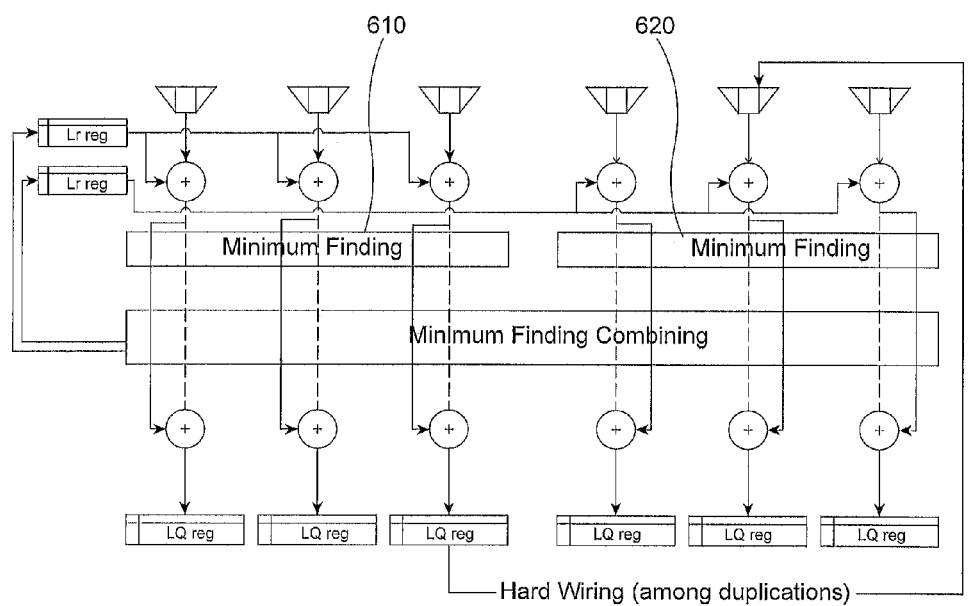
FIG. 6 A concept diagram of a possible decoder architecture.

FIG. 6 is a concept diagram of a possible decoder architecture for decoding of LDPC codes. The decoder is iterative and an embodiment can utilize well-known update equations. In this example embodiment we make use of conventional update equations (below) for a layered belief propagation decoder with minimum finding as the parity processing, but other update equations can be utilized.

$$LQ_d = \sum_i m_{i,d}$$

Init: $LQ_d$ from demapper, $Lr = 0$

Iterations are $\begin{cases} Lq_{d,j} = LQ_d - Lr_{j,d}^{old} \\ Lr_{j,d}^{new} = \prod_{i \neq d} \text{sign}(Lq_{i,j}) \min_{i \neq d} |Lq_{i,j}| \\ LQ_d \leftarrow Lq_{d,j} + Lr_{j,d}^{new} \end{cases}$ In every clock a layer is processed using these equations: the a-posterior Log Likelihood Ratio (LLR) is termed LQ and has the previous extrinsic value (Lr_old) being subtracted, the resulting extrinsic information (Lq) is the input to the parity check processing, where new extrinsic value (Lr_new) is output and added to the Lq value to generated a newly updated LQ value (a-posterior LLR). At the end of processing of a layer, LQ values are stored according to FIG. 6 in appropriate registers (termed in FIG. 6 LQ-reg). New extrinsic value (Lr_new) becomes previous extrinsic value (Lr_old) next time this same layer is processed.

One should observe that LQ values are per variable node and Lr values are per {variable node, check node} pair. However, since the new Lr values are the output of minimum finding over several inputs (with respect to their absolute value), then the absolute value of the new Lr outputs comprises only 2 possible values—the minimum and the "almost minimum".

Moreover, modifications such as moving the LQ registers to the output of the multiplexers are also equally relevant. Finally, it should be appreciated that many other architectures may be relevant to the contents of the embodiments herein, such as different arrangement of interconnected components or utilizing a different update equation such as, for example the below Sum-Product algorithm.

$$LQ_d = \sum_i m_{i,d}$$

Init: $LQ_d$ from demapper, $Lr = 0$

Figure 7:
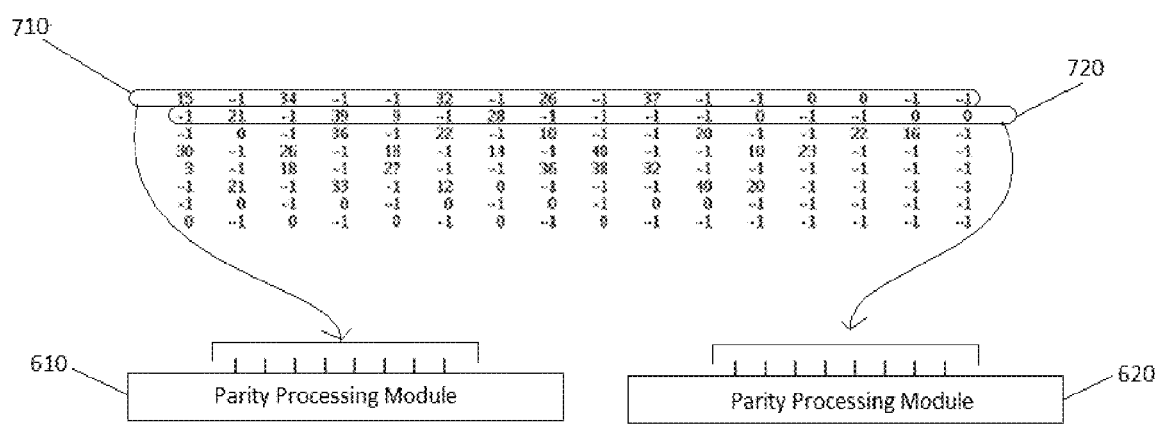
FIG. 7 An illustration a layer being inputted to two Parity processing Modules.

Iterations are $\begin{cases} Lq_{d,j} = LQ_d - Lr_{j,d}^{old} \\ Lr_{j,d}^{new} = 2\tanh^{-1}\left(\prod_{i \neq d} \tanh\left(\frac{Lq_{i,j}}{2}\right)\right) \\ LQ_d \leftarrow Lq_{d,j} + Lr_{j,d}^{new} \end{cases}$ FIG. 7 illustrates the processing of layers of an LDPC code matrix. For ease of understanding, note that the concept diagram of FIG. 6 can fit nicely the LDPC code presented in FIG. 5, where layers have two rows to be processed; the layer's two rows find their counterparts in the two parity processing modules. The architecture is of course more general and extension to any number of rows per layer is trivial. For this illustration since we're talking about degree-1 layers at most, we can decide to use two modules 610 and 620 of parity processing with 8 ports per module; the layer's first row 710 is input for parity processing module 610 and the layer's second row 720 is input for parity processing module 620. One should notice that the code in FIG. 7 has no more than 8 non-negative entries per row (for example, first row 710 has only 7 non-negative entries), and thus every row may be independently processed by a single module. The same procedure can be used to independently process the remaining layers and because the processing is iterative each layer can be processed multiple times, and thus after processing the last layer it may return to the first layer.

There are multiple possibilities for how the layer gets processed. The layer's first row 710 could be processed by the second module (620) and the layer's second row 720 be processed by the first module (610). These parity processing modules could be any equivalent parity check processing unit such as, for example a module performing minimum finding or belief revision or min-sum algorithm or a module performing belief propagation or sum-product algorithm. There could be LDPC codes with N columns and layers that have total of n<N non-zero columns (for example, consider N=24 and consider layers such that only 16 entries at most contain non-zeros in every layer). In this case, we need the modules to support up to small n of inputs for comparisons, and up to N registers. Supportive hardware will make sure that the N-n entries will not affect the minimum finding results while these entries are somehow maintained in registers until they are used next.

Figure 8:
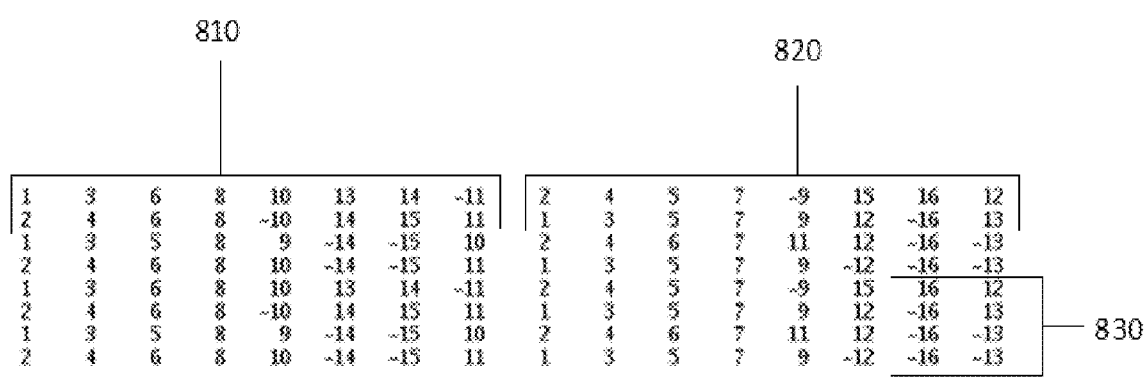
FIG. 8 is an example Location Matrix corresponding to the parity check matrix in FIG. 5.

FIG. 8 illustrates an example of location matrix based on the LDPC code matrix of FIG. 5 and includes two iterations of processing. The location matrix shows the mapping of the code bits corresponding to the order addressed by the LDPC code matrix to the ports of the minimum finding modules (or any other types of parity check processors). Equivalently, the location matrix shows the mapping of the columns of the QC matrix to the ports of the minimum finding modules for every layer. The location matrix comprises rows, columns and entries. Each row signifies the processing of a layer, in this example we process a layer per clock. The first 4 rows of the matrix represent the first iteration and the next 4 rows 830 represent the second iteration, there could be a plurality of iterations but for this example we chose just 2. In most implementations, every iteration (except the first that deals also with loading data into the decoder) is the same as the second iteration, which is another reason to present only 2 iterations. Each column of the location matrix signifies a port of the minimum finding modules, so the column number maps to a port number. The first set of 8 columns 810 map to the 8 ports of minimum finding module 1 610 and the second set of 8 columns 820 (9-16) map to the 8 ports of minimum finding module 2 620. Each entry correlates to a numbered LDPC code matrix column which is associated with a sub-block of the original codeword and a permutation matrix. The entries that are negative numbers represent the respective sub-block of bits located in the port associated with its column number but preventing the minimum finding module from conducting minimization over them. This can be performed by setting the port output equal to the input for the port. There are many ways to do so, by multiplexers, by setting a "disable" to the registers etc.

By looking at the first row of FIG. 8 we can see the first 8 entries are 1, 3, 6, 8, 10, 13 14 and −11. These indicate that columns 1, 3, 6, 8, 10, 13, 14 and 11 of the LDPC code matrix of FIG. 5 are used to feed the 8 ports of minimum finding module 1 during first clock, because of the negative sign column 11 is used to feed the first module but during this clock the module's minimization will not address the port associated with "11" ($8^{th}$ port of module 1 in FIG. 8, during first clock). The remaining set of 8 entries (9-16) in the first row of FIG. 8 are 2, 4, 5, 7, −9, 15, 16 and 12 which indicate that columns 2, 4, 5, 7, 9, 15, 16 and 12 of the LDPC code matrix of FIG. 5 are used to feed the 8 ports of minimum finding module 2, during first clock, and that $5^{th}$ port (holding data relevant to $9^{th}$ column of the parity check matrix) does not participate during this clock in the minimization.

Now looking at the entries by column we see the third column has entries are 6, 6, 5, 6, 6, 6, 5, and 6. Again each entry indicates the column number of the LDPC code matrix of FIG. 5 however now it is over the course of time because each row signifies a clock. For example row2,column3 has the entry 6 this indicates that during the second clock an input corresponding to 6th column of LDPC code matrix is used to feed port 3. Now looking at the next row(3) we see the entry 5 which indicates during the 3rd clock an input corresponding to 5th column of LDPC code matrix is used to feed port 3.

To be more clear "an input corresponding to the 6th column of the LDPC code matrix" would mean retrieving estimates of the variable nodes associated with the $6^{th}$ column of the code. The location matrix does not contain information about the permutation that these estimates need to undergo.

This location matrix is derived from the LDPC code matrix in FIG. 5 in the following manner. Each layer of the LDPC code matrix is analyzed to derive a row in the Location Matrix. In the previous description of FIG. 5 we established that the layer's first row is going to be processed by minimum finding module 1 and the layer's second row would be processed by minimum finding module 2. As a result the layer's first row is analyzed to derive a first set of location matrix entries which will populate the location matrix columns that map to minimum finding module 1 which in our example are location matrix columns 1-8. The layer's second row is analyzed to derive a second set of location matrix entries which will populate the location matrix columns that map to minimum finding module 2 which in our example are location matrix columns 9-16. Analyzing a layer's row involves creating a set of location matrix entries wherein each entry is the LDPC code matrix's column number of a column with a non-negative value. An LDPC code matrix column with only negative entries in the layer will result in a location matrix entry that is negative.

Figure 9:
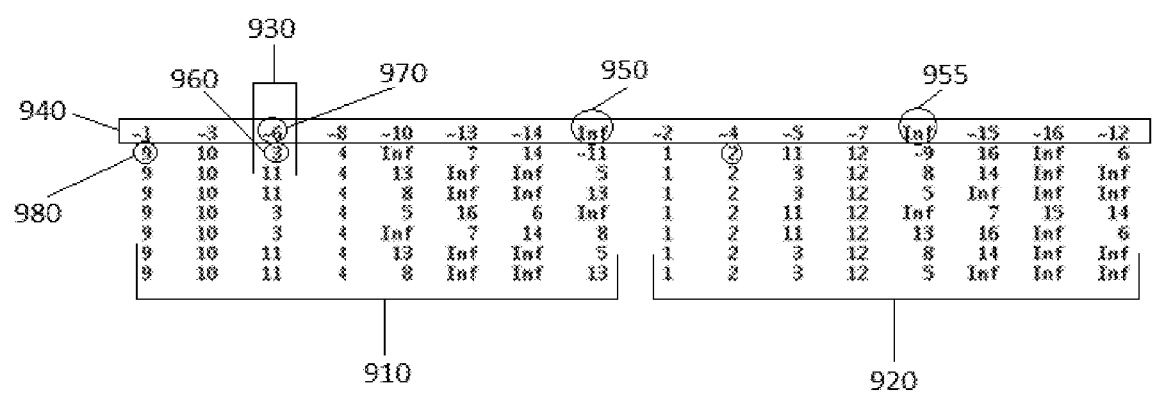
FIG. 9 illustrates an example Routing Matrix corresponding to the location matrix illustrated in FIG. 8.

FIG. 9 illustrates an example of a routing matrix. This routing matrix is associated with the location matrix of FIG. 8. A Routing matrix is uniquely defined by a location matrix and inversely a location matrix is uniquely defined by a routing. Each Routing matrix row signifies the processing of an LDPC code layer given the arrangement in the processing of previous layer, in this example we process a layer per clock. Each Routing matrix column signifies a port of the minimum finding modules, so the column number of the Routing matrix maps to a port number. For example the first set of 8 columns 910 map to the 8 ports of minimum finding module 1 and the second set of 8 columns 920 (9-16) map to the 8 ports of minimum finding module 2. The routing matrix positive entries represent the port from which it will receive data. The negative entries signify the loading of a codeword sub-block in accordance with the LDPC column. Inf (infinite) mean that the port does not receive data to participate in minimum finding. Thus the first row entries of −1, −3, −6, −8, −10, −13, −14 and Inf correspond to loading the LDPC code matrix columns 1, 3, 6, 8, 10, 13 and 14 into ports 1-7 and because the $8^{th}$ entry is Inf 950 this port does not participate in minimization during this clock time and its input may be arbitrary. The remainder of the first row entries of −2, −4, −5, −7, Inf, −15, −16 and −12 correspond to loading the LDPC code matrix columns 2, 4, 5, 7 and 15, 16, 12 into ports 9-12 and 14-16 respectively, because the $13^{th}$ entry is Inf 955 input port 13 is arbitrary fed. Other than the negative numbers, a positive finite number represents a wire connected to an output port. For example, the entry 9 (980) in row 2 column 1 implies that the output of the $9^{th}$ port (essentially relevant to first port of minimum finding module 2) is to be fed to the $1^{st}$ port during next clock. Similarly, the entry 3 (960) in row 2 column 3 means that the output of $3^{rd}$ port is to be fed to the input of the $3^{rd}$ port in the next clock. Another example is the data that was initially loaded into port 3 according to LDPC code matrix column 6 during clock 1 (represented by the routing matrix entry −6 (970) at row 1 column 3) is also fed to that port during the next clock. In this example, we assume that an INF entry means that the port does not receive data but that prior data is kept intact in the register throughout the relevant clock interval (i.e., using an "enable" set to disable). Any method of maintaining these values is relevant and applicable such as for example transferring the output value to another location without participating in the minimum finding processing is also covered by this patent.

The routing matrix can be used as rules for the multiplexers depicted in FIG. 6. For example, one might consider the $3^{rd}$ column of the routing matrix as implemented by a 3→1 multiplexer with the following options: (1) read sub-block 6 of the codeword (2) feed this port from port number 3, and (3) feed this port from port number 11.

The routing table is, however, a partial representation of the data being received by the port. This is because the permutations relevant to the code were not addressed so far. For example, addressing the $3^{rd}$ port as indicated by the $3^{rd}$ column of the routing matrix, the first clock requires loading of sub-block number 6 from the input to the decoder wherein the parity check matrix indicates that a permutation of value 32 is required. Continuing the example, at next clock output of port 3 is fed to its input (thus addressing same data of same sub-block 6) but according to the parity check matrix a permutation value of 22−32=−1=32(modulo 42) is required. At the next clock output of port 11 is fed to input of port 3; by tracking the Routing matrix or inspecting the location matrix it is evident that this data corresponds to handling sub-block 5, whose differential permutation in the transition from layer 2 to layer 3 is equal to 27−18=9. At next clock port 3 is again fed from port 11, which currently holds data associated with sub-block 6 and the differential permutation required this time is 0−12=30(modulo 42). At next clock (first clock of next iteration) port 3 is fed from output of port 3 (hence, sub-block 6) with a differential permutation of 32−0=32. This latter operation may already reuse the wire used during second clock, since we feed the port from same output port with same permutation. So, we understand that the following 4 wires at the input to the mux of port 3 are required: (1) read column 6 from input to the decoder, while permuting by 32, (2) feed this port from port number 3 using permutation of 32, (3) feeding this port from port number 11 using permutation of 9, (4) feeding this port from port number 11 using permutation of 30. With the above in mind, we may regard our architecture as involving several many-to-one multiplexers that implement the wiring related to the layers for various clock intervals. For example, one of the mux may correspond to the following options

| −10 | Inf | 13 | 8  | 5  |
|-----|-----|----|----|----|
| 37  | Inf | 40 | 10 | 37 |

Where first input corresponds to reading the $10^{th}$ column (a.k.a. estimates associated with sub-block number 10) with a permutation of 37, second input to having "disable" this port from participating in minimization, $3^{rd}$ input to reading to this port from the output of port 13 and applying a permutation of 40 while doing so, $4^{th}$ input to reading to this port from output of port 8 with permutation of 10 while doing so and $5^{th}$ input to read to this port from the output of $5^{th}$ port with a permutation of 37. In some embodiments, selection of multiplexer input may be according to order pre-stored in the hardware. The example above is in far the mux associated with the $5^{th}$ column of the routing matrix. If this mux is associated with only the code in FIG. 5, then $5^{th}$ input is used to operate on first layer during the next iteration.

Figures 10, 11, 12, 13, 14:
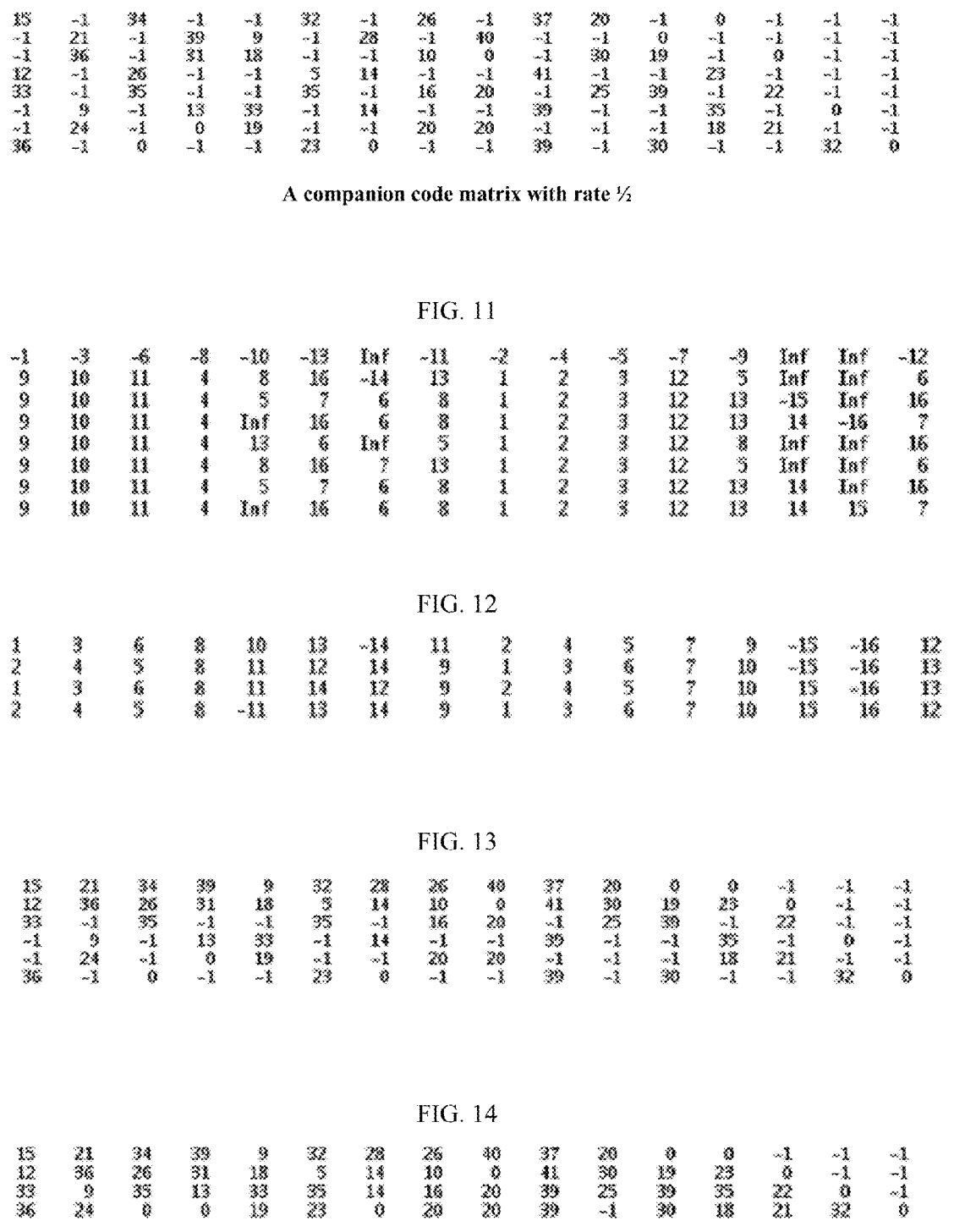

FIG. 10 illustrates possible companion code to the LDPC code represented in FIG. 5. These companion codes utilize the existing multiplexers as a pool of routing options and hence share the multiplexers fully or partially. The companion code may be of the same rate or of a different rate.

A new companion code may have for example the routing matrix seen in FIG. 11 and may have for example the location matrix as seen in FIG. 12.

One may observe that the routing of the $3^{rd}$ port, for example, is different—it never takes from port 3 as the code in FIG. 5 but constantly takes from port 11. Again, these tables do not disclose differences in permutations that may necessitate more wires (input to the multiplexers). For example, port 3 of minimum finding module 1 may have the following multiplexer inputs for the first code (as explained in details above)

| −6 | 3  | 11 | 11 |
|----|----|----|----|
| 32 | 32 | 9  | 30 |

Example Multiplexer Input for First Code

The companion code may require extension of the multiplexer inputs over the first code

| −6 | 3  | 11 | 11 | 11 |
|----|----|----|----|----|
| 32 | 32 | 9  | 30 | 28 |

Example Multiplexer Input for Companion Code

Of course, a selector table controls the multiplexer. For the first code, it may point to

| entries: | 0 | 1 | 2 | 3 | 1 | 1 | 2 | 3 | and for the second code it may point to

| entries: | 0 | 2 | 3 | 4 | 2 | 2 | 3 | 4 |

This is to say that some of the mux inputs are reused among the codes (could be several companion codes) and some inputs may belong each to its own code. For example, entry number 1 (port 3 with permutation of 32) is solely used by the first code while entry number 4 (port 11 with permutation of 28) is solely used by the second code. The other entries (decoder input[0], entries 2 & 3) are used by both codes. This reuse of mux inputs may result in codes that have inter-relationships among small sets of columns only. For example, the companion code in FIG. 10 has the $3^{rd}$ port inter-connecting only with itself In the first code it used to connect only with itself and with the $11^{th}$ port. We do not see this port as inter-relating with many ports in general (although some sets of columns may have this property). This "localization" property is also significant to placement and routing.

Comparing the codes in FIG. 10 with the code in FIG. 5, we see that there is no salient similarity between the companion codes (in one of the rates). This is attributed to the fact that the code is expressed in terms of cyclic permutations and since the method described above controls differences of permutations, then order of differential permutations and possibly the enriching of the set may result in completely different permutations for the companion codes. Note, however, that first layer was deliberately left the same for the first code and the companion code. However, the proposed concept does not force us to reuse all decoder-input multiplexers and we may define others (probably few) and thus enrich the pool of multiplexer options even with inputs to the decoder. It is important to emphasize that the generation of a companion code may be for any desired structure, and we need not be confined to structure related to the first code. By structure here we mean the locations of "connectivity", ignoring the permutation index in those locations.

Embodiments herein provide methods and a system to perform decoding of LDPC codes using hardware, with an architecture that is efficient in terms of silicon area. In these embodiments, the hardware comprises parity check processing units having plurality of input ports and plurality of output ports. In some embodiments, the input ports contain memory capabilities such as registers or flip-flops while in other embodiments the output ports contain these memory capabilities. In some embodiments memory capabilities may exist in both types of ports simultaneously.

The parity processing units provide the capability of updating the bits' reliability under the constraints imposed by parity check equations according to the code's parity check matrix. The processors may be configured to address different subsets of their inputs and to update the corresponding subsets of their outputs.

A layered decoder comprises parity check processing units and means for connectivity such that the processing units may be reused among layers. In order to operate the layered decoder, data related to the bits' estimates (made of sign and reliability usually) has to be stored and routed properly to the processing units' inputs.

Embodiments herein provide means for efficient connectivity. In particular, every input port may be associated with a multiplexer where said multiplexer allows choosing among plurality of output ports from the plurality of parity check processors and it may also allow choosing among inputs to the decoder. Considering, for example, a decoder designed for decoding of a single LDPC code, we define connectivity as explained above to be "efficient connectivity" if the number of output ports connected to an input port is less than or equal to the number of layers processed by the decoder. It should be clear that the hardware component connecting all output ports whose data may be delivered to said input port is considered as a single multiplexer. For example, the set of components comprising a multiplexer choosing its input from two multiplexers, is considered herein a single multiplexer.

As an example of a non-efficient connectivity, one may consider multiplexing in two layers, wherein first layer chooses input from a storage associated with columns of a parity check matrix and a second layer responsible for choosing an estimate of a bit from within all estimates associated with all bits in the sub-block associated with chosen column of said QC parity check matrix. This connectivity is not efficient, since data can traverse over wires in paths not selected by the decoder.

Embodiments herein also provide for a decoder that handles a plurality of LDPC codes. Efficient connectivity for such a decoder means that no unused paths exist, which can be formally stated as follows. Considering the set of wires (or inputs to a multiplexer) that are used for every code independently, the connectivity is efficient if the number of inputs to the multiplexer (excluding inputs from the demapper) is exactly equal to the union of the inputs employed for the decoding of each supported LDPC code. For example, if we name the inputs to a decoder by A, B, C, D and E, the efficient connectivity may be expressed by first code utilizing inputs A, B and C, second code utilizing inputs A, B and D and third code utilizing inputs B, D and E, wherein utilizing means that the decoder selects these inputs when it decodes according to this code. It should be appreciated that efficient connectivity for an input port conforms to the definition above, but efficient connectivity for a decoder means that a substantial amount of input ports has efficient connectivity.

Furthermore, in some cases connectivity may be quasi-efficient, meaning that the ratio between the number of possible paths to the number of used paths with respect to an input port is small. For example, the set of all possible paths may be no more than twice the number of used paths. Accordingly, a decoder may be quasi-efficient if a substantial amount of input ports are quasi-efficient.

Embodiments herein provide quasi efficient connectivity, wherein said connectivity is associated with the difference of permutations of the parity check matrix, also captured by the entries of the differential permutation matrix. Input ports of the plurality of parity check processing units (for example, input port number 1 of a set of Z=42 units) may be considered as pertaining to a cluster. All estimates of bits associated with a certain column may be traversed simultaneously to input ports of a certain cluster. Moreover, if order of estimates of the bits (within a cluster) as may be available in output ports corresponds to order according to a permutation associated with a column of said parity check matrix as indicated by the entry in said matrix in corresponding layer, and if the order required for the input ports in next layer is indicated by the corresponding permutation in next layer of the matrix, then the estimates of the bits have to be reordered according to the cyclic permutation that is the difference of the permutations, i.e., according to the value denoted by the differential permutation matrix. Therefore a "wire" is connectivity between an output port and an input port that also reorders the estimates within a cluster, where the reordering is essentially according to a relevant differential permutation.

Embodiments herein support connectivity such that if two LDPC codes require same differential permutation for traversing data from same cluster of output ports to same cluster of input ports, then the wires connecting these ports may be reused and also an input in each multiplexer in said cluster may be reused. This results in significant reduction of hardware for supporting plural of LDPC codes by a single decoder.

Therefore, it should be appreciated that having large commonality among differential permutation matrices with respect to their entries is an indication of significant reuse offer that can be expressed by small hardware for supporting decoding of plural of codes. For example, the differential permutation of the value 7 appearing in the second row and first column of FIG. 4 should be considered with respect to the differential permutation of the value 7 appearing in the second row and first column of FIG. 16 and also in the fourth row and first column of FIG. 16. In the exemplified case, reuse of wires (and multiplexers' inputs) is enabled among processing of second layer of the code in FIG. 3, processing of second layer of the code in FIG. 15 and processing of the fourth layer of the code in FIG. 15. It should be appreciated in addition that having a value of a differential permutation appearing multiple times in a certain differential permutation matrix may also indicate that efficient reuse can be applied for decoding among layers of an LDPC code.

To be able to measure the amount of reuse offered by a set of two codes, a metric that captures this property is now defined. Assume a given connectivity, and let $X_1$ be the number of "active" wires from within this connectivity used for decoding of first code. Similarly, let $X_2$ be the number of "active" wires within this connectivity used for decoding of second code and let $X_3$ be the number of wires in this connectivity. The connectivity is required to be efficient, so that $X_3$ equals to the number of wires being "active" for decoding of either first code or second code. The term "active" in this respect stands for wires that data will be conveyed over them during the decoding process. The metric is now given by $(X_3-\max\{X_1,X_2\})/\min\{X_1,X_2\}$ and it captures the ratio between the number of additional wires with respect to the code with more wires and between the number of wires used by the code with the less wires. Furthermore, wires may be counted with respect to connectivity of clusters of ports as defined above (for example, connection of $Z=42$ output ports of one cluster to $Z=42$ input ports of another cluster may be counted as "1 wire").

Metric calculation requires that the number of "wires" is found for a given set of LDPC parity check matrices. It is understood that in order to calculate a metric, a connectivity leading to the calculated metric has to be presented. There can be a very large number of ways to connect output ports and input ports to implement a given set of LDPC codes, and hence there could be many possible values for the ratio of the number of wires for a strictly efficient connectivity. However, because large reuse of hardware requires attention at the design of the matrices as well as at the design of the routing paths, it is reasonable to state that demonstrating metric of small value is not trivial, unlike demonstrating metric of large value.

Figures 15, 16, 17, 18:
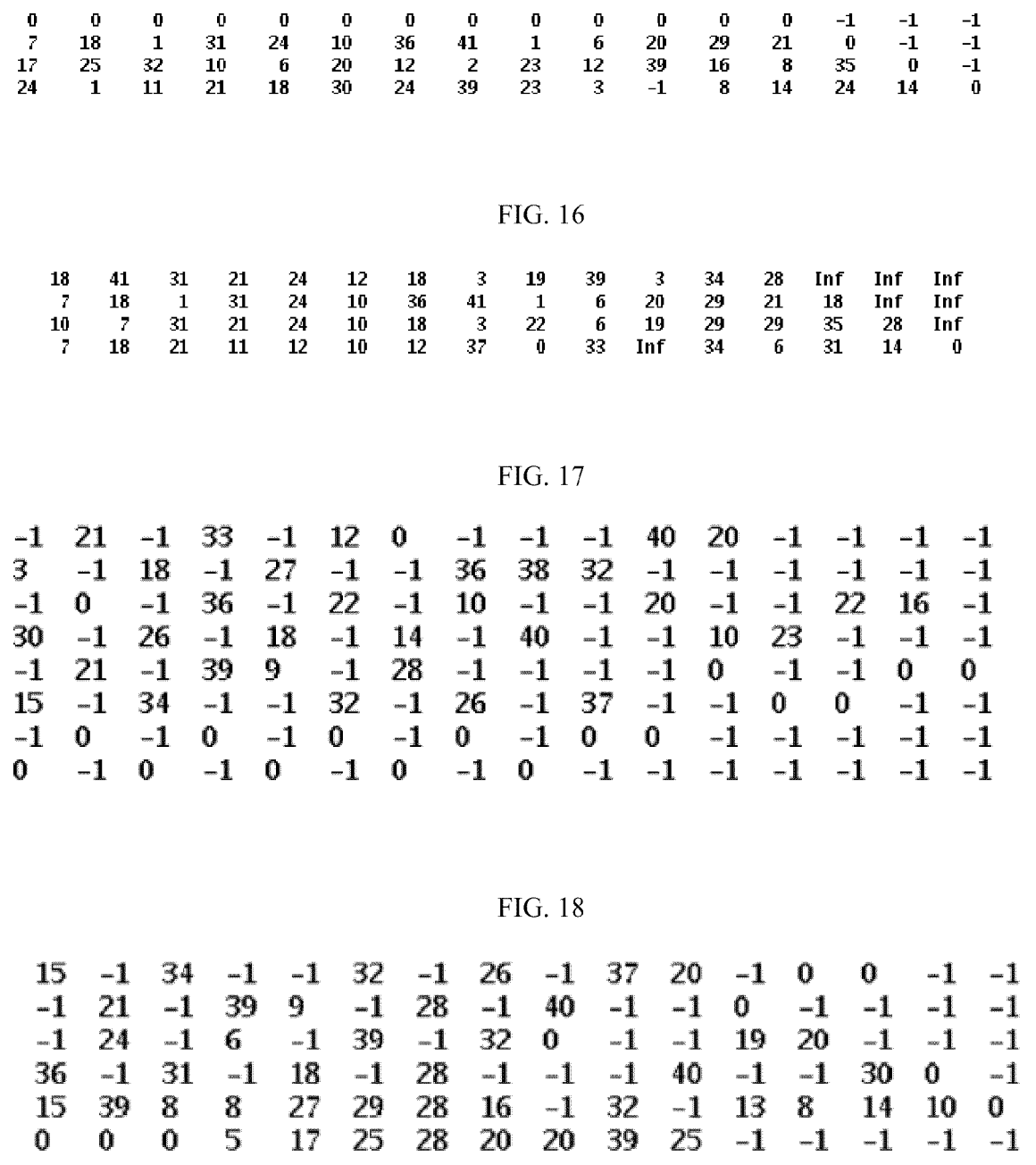

For example, consider the codes in FIG. 3 and in FIG. 15. It is possible to process the first two columns of both codes with connectivity that addresses two ports (denoted by A and B, residing in different modules in this example) wherein port A has one input connected to output port B with a differential permutation equal to 18 and a second input connected to output port B with a differential permutation equal to 10, and port B has one input connected to output port A with a differential permutation equal to 41 and a second input connected to output port A with a differential permutation equal to 7. In addition, both ports have an input connected to the input of the decoder, which is typically the de-mapper. In this example, every port has 3 inputs and therefore we count a total of 6 "wires". The order of the selection among the inputs in this example may be given for port A and first code by 2 (pointing to the input from the demapper) at the first time and by 0 in every other time (i.e., using the path with differential permutation equal to 18) and for port B for same code by 2 (i.e., demapper) at the first time followed by alternating twice 1 and twice 0. For the second code (in FIG. 15) port A will use the order 2, 0, 1, 0, 0, 0, 1, 0, 0, 0, 1, 0, 0, . . . and port B will use the order 2.1.1.1.0.1.1.1.0.1.1.1, . . .

Continuing this example, one can show efficient connectivity such that number of "wires" for the code in FIG. 3 is $X_1=56$, the number of "wires" for the code in FIG. 15 is $X_2=60$ and the number of "wires" for supporting both codes is $X_3=79$, resulting in a metric equal to $(79-60)/56$ which is approximately 0.34.

The metric defined above, which is hereby denoted as "the wiring metric" is upper bounded by 1 (attained in the case where all wires are disjoint). Moreover, random drawing of differential permutations for a given multiplexer and ignoring the fact that the wires also have to connect to proper output ports (i.e., without considering the possibility that two differential permutations can still be the same but correspond to different wires because of port identity), the average of the wiring metric is approximately equal to 0.9 for $Z=42$ and 4 layers for a single multiplexer. The probability of said metric being below 0.5 (for $Z=42$ and 4 layers) equals to approximately 3 percent for a single multiplexers and therefore the probability of said metric below 0.5 is significantly less than 3 percent for 16 multiplexers simultaneously (where the number $Z=42$, 4 layers and 16 multiplexers may address the code in FIG. 3 and in FIG. 15 for example). Therefore, it is reasonable to say that two codes have inherent reuse with respect to the wiring metric if the value of this metric (for the connectivity of the entire decoder) is below some threshold such as 0.5, 0.45 or 0.4.

Those skilled in the art may be familiar with a different class of LDPC codes that possesses significant reuse with respect to the wiring metric. Such are the codes in IEEE 802.15.3c, for example. Codes from this class, when implemented with efficient connectivity will actually operate the selectors of the multiplexers exactly the same for substantial amount of multiplexers when each of the various codes is processed. In terms of the differential permutation matrix like those presented in FIG. 4 and FIG. 16, such codes will have the same differential permutation matrix up to very few different entries. This class of codes is relatively constrained with respect to its richness of codes that can be afforded by layered belief propagation decoders. Hence the motivation to generate a new class of LDPC codes that has both significant reuse and that is not restricted to essentially same differential permutation matrix for plural of codes.

Again, in order to differentiate between LDPC classes that have essentially same differential permutation matrix and LDPC classes that do not have this property, a second metric has to be defined. This metric, denoted as "the similarity metric" is defined as follows. Every entry in the differential permutation matrix is compared between the representatives of both codes and a "1" is counted for every similar entry and "0" for every non-similar entry. The row ordering and the number of layers is required to be identical to the one used for the calculation of the "wiring metric". The ratio of the total count to the number of entries in the differential permutation matrix is then defined as the value of the similarity metric. The class in the prior art mentioned above will typically have similarity metric values of 0.7 or above.

The class of codes provided herein is such that it enables itself to large reuse of hardware and small wiring when implemented using the architecture of "efficient connectivity" described above. It is noted that this is measured by wiring metric being below a certain threshold and by that the wiring metric actually captures inside it a specific architecture for a decoder, although an implemented decoder operating on codes from this class of codes may be not related to the architecture assumed by the defined metric. Also, the class provided herein does not require considerable similarity, which can be captured by similarity metric being below a certain threshold (such as 0.5).

Some additional LDPC matrices that are generated according to the specified concept are illustrated in FIG. 17 and FIG. 18. Below are the Matlab notations associated with these matrices.

The set of multiplexers used to generate these is given (in Matlab notation) by:
Mux{1}=[−1 9 9 9; 15 21 15 3];
Mux{2}=[−3 0 10 10 10; 34 39 34 9 19];
Mux{3}=[−6 3 11 11 3 11; 32 32 9 30 7 38];
Mux{4}=[−8 4 4 4; 26 26 6 4];
Mux{5}=[−10 Inf 13 8 5 5 13; 37 Inf 40 10 37 26 27];
Mux{6}=[−13 7 Inf 16 6 7; 0 22: Inf 19 34 30];
Mux{7}=[−14 14 Inf 6 16 7 16; 0 16 Inf 20 31 28 26];
Mux{8}=[Inf −11 5 13 8 8; Inf 20 37 2 20 0];
Mux{9}=[−2 1 1 1 1; 21 15 21 39 27];
Mux{10}=[−4 2 2 2 2; 39 34 39 24 2];
Mux{11}=[−5 11 3 3 11; 9 9 32 15 34];
Mux{12}=[−7 12 12; 28 28 0];
Mux{13}=[Inf −9 8 5 13 13 5; Inf 40 20 4 40 20 7];
Mux{14}=[−15 16 14 Inf 7 14; 0 10 10 Inf 26 32];
Mux{15}=[−16 Inf 15; 0 Inf 0];
Mux{16}=[−12 6 Inf 14 7 16 6; 0 23 Inf 22 30 29 36];
The set of selector values (that control these multiplexers) for the rate ½ code is given by
RateHalfSelector{1}=[0 1 2 1 2 1 2 1];
RateHalfSelector{2}=[0 1 2 3 2 1 2 3];
RateHalfSelector{3}=[0 1 2 3 1 1 2 3];
RateHalfSelector{4}=[0 1 1 2 1 1 1 2];
RateHalfSelector{5}=[0 1 2 3 4 1 2 3];
RateHalfSelector{6}=[0 1 2 2 3 1 2 2];
RateHalfSelector{7}=[0 1 2 2 3 1 2 2];
RateHalfSelector{8}=[0 1 2 3 0 4 2 3];
RateHalfSelector{9}=[0 1 2 3 2 1 2 3];
RateHalfSelector{10}=[0 1 2 3 2 1 2 3];
RateHalfSelector{11}=[0 1 2 3 1 1 2 3];
RateHalfSelector{12}=[0 1 1 2 1 1 1 2];
RateHalfSelector{13}=[0 1 2 3 0 4 2 3];
RateHalfSelector{14}=[0 1 2 3 4 1 2 3];
RateHalfSelector{15}=[0 1 1 1 2 1 1 1];
RateHalfSelector{16}=[0 1 2 2 3 1 2 2];
The set of selector values for the rate ⅝ code is given by
Rate58Selector{1}=[0 3 1 3 2 3 1 3];
Rate58Selector{2}=[0 3 4 1 2 3 4 1];
Rate58Selector{3}=[0 4 2 5 4 4 2 5];
Rate58Selector{4}=[0 2 1 3 2 2 1 3];
Rate58Selector{5}=[0 1 4 6 2 1 4 6];
Rate58Selector{6}=[0 3 5 2 4 3 5 2];
Rate58Selector{7}=[0 3 6 2 5 3 6 2];
Rate58Selector{8}=[1 3 0 4 2 3 0 4];
Rate58Selector{9}=[0 2 1 4 2 2 1 4];
Rate58Selector{10}=[0 2 4 1 1 2 4 1];
Rate58Selector{11}=[0 1 2 2 4 1 2 2];
Rate58Selector{12}=[0 2 2 2 2 2 2 2];
Rate58Selector{13}=[1 2 0 6 2 2 0 6];
Rate58Selector{14}=[3 0 2 3 3 5 2 3];
Rate58Selector{15}=[1 1 0 1 1 1 2 1];
Rate58Selector{16}=[0 4 6 2 5 4 6 2];
Note that a selector of value 0 selects the first entry of the multiplexer (mux). The Mux values given above represent in their first row (Matlab notation) the port to select from and in their second row (Matlab notation) the differential permutation that has to be applied. A value "Inf" in the Mux entries represent that the relevant input should not participate in the parity check processing. In some embodiments, for example, where parity check processing is done by minimum finding, feeding the maximal allowed value results in similar effect, as the maximal allowed value can never be selected as the minimum.

Non-binary QC LDPC codes are defined similarly to binary QC LDPC codes. Every entry in the QC representation is an indication of a cyclic shift permutation, where a permutation matrix has a structure like $$\begin{pmatrix} 0 & 0 & \delta \\ \alpha\delta & 0 & 0 \\ 0 & \alpha^2\delta & 0 \end{pmatrix},$$

shown here with Z=3 and for GF(4). The parameter $\delta$ is the entry in the QC representation and $\alpha$ is a generating element of the finite field. Naturally, this permutation matrix involves two operations: cyclic shift and multiplication by the field generating element to some power and naturally, a compound operation of two such permutations is also expressed by these two exact operations—cyclic shift and multiplication by the field generating element to some (other) power. We may therefore call the compound permutation similarly to the term used above—differential permutation, where the "difference" here is with respect to one inverse permutation (in previous layer) followed by one direct permutation (in current layer).

The invention claimed is:

1. A method comprising using, in a low density parity check code encoder or decoder, two or more low density parity check codes for processing low density parity check codewords, each of the low density parity check codes being represented by a low density parity check code matrix, at least two of the two or more low density parity check code matrices are associated with a wiring metric and a similarity metric, the wiring metric being below a wiring threshold value and the similarity metric being below a similarity threshold value.

2. The method of claim 1, wherein the processing low density parity check codewords comprises decoding the low density parity check codeword.

3. The method of claim 1, wherein the processing low density parity check codewords comprises encoding the low density parity check codeword.

4. The method of claim 1, wherein the wiring threshold value is equal to 0.45.

5. The method of claim 1, wherein the similarity threshold value is equal to 0.5.

6. The method of claim 1, wherein using the low density parity check code comprises a low density parity check code matrix having a code rate ½ matrix comprising a majority of following entries:

| 0 | −1 | 0 | −1 | 0 | −1 | 0 | −1 | 0 | −1 | −1 | −1 | −1 | −1 | −1 | −1 |
|---|---|---|---|---|---|---|---|---|---|---|---|---|---|---|---|
| −1 | 0 | −1 | 0 | −1 | 0 | −1 | 0 | −1 | 0 | 0 | −1 | −1 | −1 | −1 | −1 |
| −1 | 18 | −1 | 31 | −1 | 22 | 30 | −1 | −1 | −1 | 19 | 0 | −1 | −1 | −1 | −1 |
| 7 | −1 | 21 | −1 | 0 | −1 | −1 | 3 | 12 | 11 | −1 | −1 | −1 | −1 | −1 | −1 |
| 25 | −1 | 10 | −1 | 30 | −1 | 6 | −1 | 41 | −1 | −1 | 29 | 0 | −1 | −1 | −1 |
| −1 | 25 | −1 | 10 | −1 | 22 | −1 | 2 | −1 | −1 | 31 | −1 | −1 | 0 | 0 | −1 |
| −1 | 1 | −1 | 41 | 36 | −1 | 24 | −1 | −1 | −1 | −1 | 8 | −1 | −1 | 21 | 0 |
| 24 | −1 | 11 | −1 | −1 | 32 | −1 | 1 | −1 | 31 | −1 | −1 | 7 | 13 | −1 | −1 | wherein each entry is defined by a row and a column.

7. The method of claim 1, wherein using the low density parity check code comprises a low density parity check code matrix having a code rate ¾ matrix comprising a majority of following entries:

```
 0   0   0   0   0   0   0   0   0   0   0   0   0  -1  -1  -1
 7  18   1  31  24  10  36  41   1   6  20  29  21   0  -1  -1
17  25  32  10   6  20  12   2  23  12  39  16   8  35   0  -1
24   1  11  21  18  30  24  39  23   3  -1   8  14  24  14   0
``` wherein each entry is defined by a row and a column.

8. The method of claim 1, wherein using the low density parity check code comprises a low density parity check code matrix having a code rate ⅝ matrix comprising a majority of following entries:

```
 0  -1   0  -1   0  -1   0  -1   0  -1  -1   0   0  -1  -1  -1
-1   0  -1   0  -1   0  -1   0  -1  -1   0  -1  -1   0   0  -1
-1  18  -1  31   6  -1  30  -1   1  -1  -1  -1  29  35  -1  -1
41  -1   1  -1  -1  10  -1  41  -1   0  20  29  -1  -1  -1  -1
17  25  32  10  12  20  18  40  -1  39  -1  21   8  24  21   0
24  35  11  21  36  32  12  39  41   3  22  -1  -1  -1  -1  -1
``` wherein each entry is defined by a row and a column.

9. An apparatus comprising a processing module associated with a low density parity check code matrix comprising a plurality of entries, the processing module configured to process a low density parity check codeword using the low density parity check code matrix, wherein the plurality of entries are associated with a first differential permutation matrix, a similarity metric and a wiring metric, the similarity metric representing a number of non-identical entries between the first differential permutation matrix and a second differential permutation matrix associated with a companion low density parity check code matrix, the similarity metric having a value below a similarity threshold value, the wiring metric representing an amount of wires needed to implement the low density parity check code matrix and the companion low density parity check code matrix, the wiring metric having a value below a wiring threshold value.

10. The apparatus of claim 9, wherein the wiring threshold value is equal to 0.45.

11. The apparatus of claim 9, wherein the similarity threshold value is equal to 0.5.

12. The apparatus of claim 9, wherein the low density parity check code matrix comprises a low density parity check code matrix having a code rate ½ matrix comprising a majority of following entries:

```
 0  -1   0  -1   0  -1   0  -1   0  -1  -1  -1  -1  -1  -1  -1
-1   0  -1   0  -1   0  -1   0  -1   0   0  -1  -1  -1  -1  -1
-1  18  -1  31  -1  22  30  -1  -1  -1  19   0  -1  -1  -1  -1
 7  -1  21  -1   0  -1  -1   3  12  11  -1  -1  -1  -1  -1  -1
25  -1  10  -1  30  -1   6  -1  41  -1  -1  29   0  -1  -1  -1
-1  25  -1  10  -1  22  -1   2  -1  -1  31  -1  -1   0   0  -1
-1   1  -1  41  36  -1  24  -1  -1  -1  -1   8  -1  -1  21   0
24  -1  11  -1  -1  32  -1   1  -1  31  -1  -1   7  13  -1  -1
``` wherein each entry is defined by a row and a column.

13. The apparatus of claim 9, wherein the low density parity check code comprises a low density parity check code matrix having a code rate ¾ matrix comprising a majority of following entries:

```
 0   0   0   0   0   0   0   0   0   0   0   0   0  -1  -1  -1
 7  18   1  31  24  10  36  41   1   6  20  29  21   0  -1  -1
17  25  32  10   6  20  12   2  23  12  39  16   8  35   0  -1
24   1  11  21  18  30  24  39  23   3  -1   8  14  24  14   0
``` wherein each entry is defined by a row and a column.

14. The apparatus of claim 9, wherein the low density parity check code comprises a low density parity check code matrix having a code rate ⅝ matrix comprising a majority of following entries:

```
 0  -1   0  -1   0  -1   0  -1   0  -1  -1   0   0  -1  -1  -1
-1   0  -1   0  -1   0  -1   0  -1   0  -1  -1   0   0  -1  -1
-1  18  -1  31   6  -1  30  -1   1  -1  -1  -1  29  35  -1  -1
41  -1   1  -1  -1  10  -1  41  -1   0  20  29  -1  -1  -1  -1
17  25  32  10  12  20  18  40  -1  39  -1  21   8  24  21   0
24  35  11  21  36  32  12  39  41   3  22  -1  -1  -1  -1  -1
``` wherein each entry is defined by a row and a column.

* * * * *